(12) United States Patent
Minzoni

(10) Patent No.: US 7,298,656 B2
(45) Date of Patent: Nov. 20, 2007

(54) PROCESS MONITORING BY COMPARING DELAYS PROPORTIONAL TO TEST VOLTAGES AND REFERENCE VOLTAGES

(75) Inventor: Alessandro Minzoni, Morrisville, NC (US)

(73) Assignee: Infineon Technologies AG, Munich (DE)

( * ) Notice: Subject to any disclaimer, the term of this patent is extended or adjusted under 35 U.S.C. 154(b) by 617 days.

(21) Appl. No.: 10/836,753

(22) Filed: Apr. 30, 2004

(65) Prior Publication Data

US 2005/0246598 A1 Nov. 3, 2005

(51) Int. Cl.
*G11C 7/00* (2006.01)
(52) U.S. Cl. .................. 365/194; 365/201; 365/189.05
(58) Field of Classification Search ............. 324/158.1, 324/537, 763, 765; 327/42; 365/189.09, 365/194, 201, 189.05; 714/724; 716/6
See application file for complete search history.

(56) References Cited

U.S. PATENT DOCUMENTS

| | | | |
|---|---|---|---|
| 5,068,547 A * | 11/1991 | Gascoyne | 326/16 |
| 5,072,138 A * | 12/1991 | Slemmer et al. | 326/16 |
| 5,486,786 A * | 1/1996 | Lee | 327/378 |
| 5,523,977 A | 6/1996 | Tobita et al. | 365/201 |
| 5,629,944 A | 5/1997 | Kagami | 371/21.4 |
| 5,631,596 A * | 5/1997 | Sporck et al. | 327/378 |
| 5,923,674 A | 7/1999 | Nakadai | 371/21.4 |
| 6,370,676 B1 | 4/2002 | Hayashi et al. | 716/6 |
| 6,960,926 B2 * | 11/2005 | Anderson et al. | 324/766 |
| 7,061,305 B2 * | 6/2006 | Kim | 327/535 |
| 7,135,896 B2 * | 11/2006 | Kobayashi | 327/108 |
| 7,183,803 B2 * | 2/2007 | Song | 326/82 |
| 2007/0132443 A1* | 6/2007 | LaBerge | 324/158.1 |

\* cited by examiner

*Primary Examiner*—Richard T. Elms
*Assistant Examiner*—Alexander Sofocleous
(74) *Attorney, Agent, or Firm*—Dicke, Billig & Czaja, PLLC

(57) ABSTRACT

An evaluation circuit includes a test circuit configured to provide a test voltage indicative of a characteristic of a semiconductor device, a reference circuit configured to provide a first reference voltage, a first delay circuit configured to convert the test voltage into a first delay, a second delay circuit configured to convert the first reference voltage into a second delay, and a first latching circuit configured to determine a relationship between the first delay and the second delay.

32 Claims, 11 Drawing Sheets

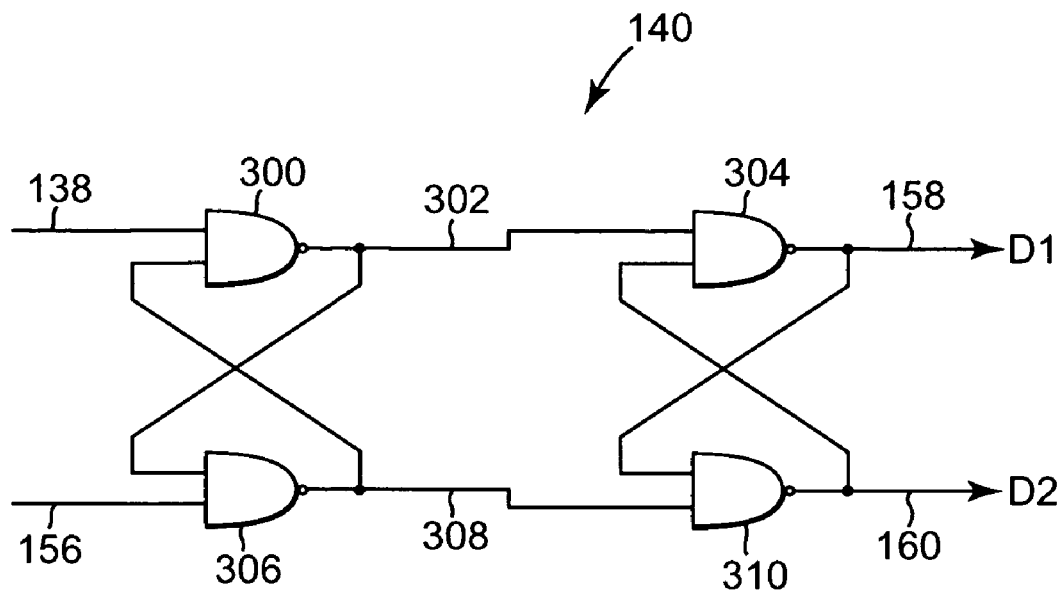
Fig. 4
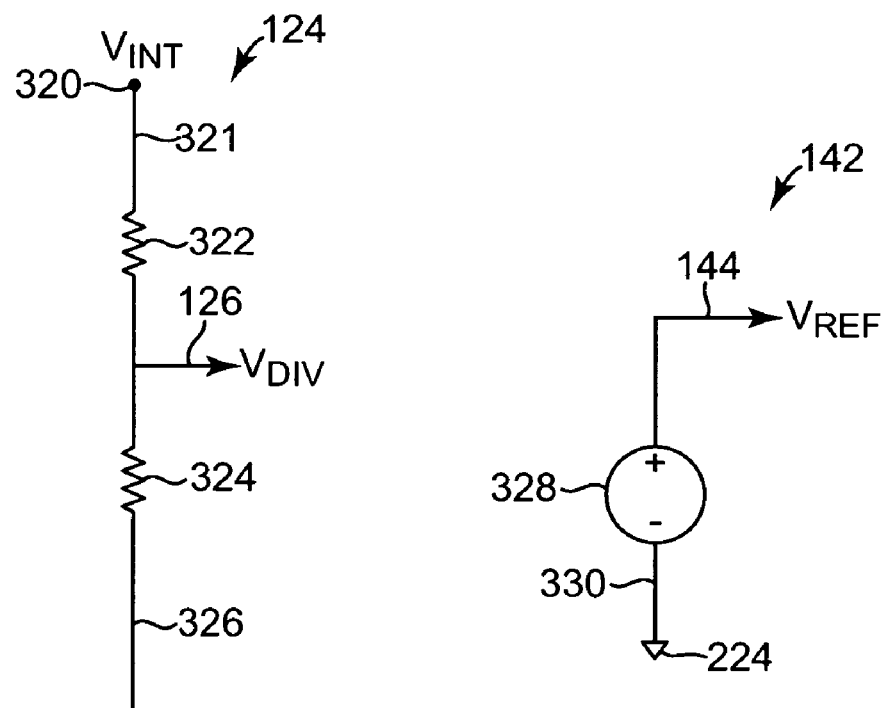
Fig. 5
Fig. 6

US 7,298,656 B2

PROCESS MONITORING BY COMPARING DELAYS PROPORTIONAL TO TEST VOLTAGES AND REFERENCE VOLTAGES

BACKGROUND

In semiconductor manufacturing, it is difficult to design and build a semiconductor chip having the same process for a positive channel field effect transistor (pFET) or negative channel field effect transistor (nFET) and the same characteristics in every batch of chips. Varying processes and characteristics of semiconductor chips from chip to chip can affect the performance of the semiconductor chip including the electrical behavior, set-up and hold times, off chip driver slew rate, etc. Sometimes these varying processes and characteristics can be so extreme that the semiconductor chip fails to meet specifications.

A representative pFET or nFET of a semiconductor chip can be tested to determine whether the process for the pFETs and nFETs in the chip are fast (strong) or slow (weak). Based on the test results, action can be taken to offset any undesirable characteristics of the semiconductor chip due to the process. In addition, if an external voltage supplied to the semiconductor chip varies, by determining the variation, action can be taken to adjust for any effects the variation may cause. For example, by evaluating the characteristics of a pFET, nFET, and/or external voltage supplied to the semiconductor chip, an off-chip driver (OCD) on the chip can be adjusted as needed to compensate for any effects due to variations in the characteristics from nominal values.

SUMMARY

One embodiment of the invention provides an evaluation circuit. The evaluation circuit comprises a test circuit configured to provide a test voltage indicative of a characteristic of a semiconductor device, a reference circuit configured to provide a first reference voltage, a first delay circuit configured to convert the test voltage into a first delay, a second delay circuit configured to convert the first reference voltage into a second delay, and a first latching circuit configured to determine a relationship between the first delay and the second delay.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

FIG. 4 is a schematic diagram illustrating one embodiment of a latch.

FIG. 5 is a schematic diagram illustrating one embodiment of a test circuit for evaluating a supplied voltage.

FIG. 6 is a schematic diagram illustrating one embodiment of a reference circuit for evaluating a supplied voltage.

DETAILED DESCRIPTION

Figure 1:
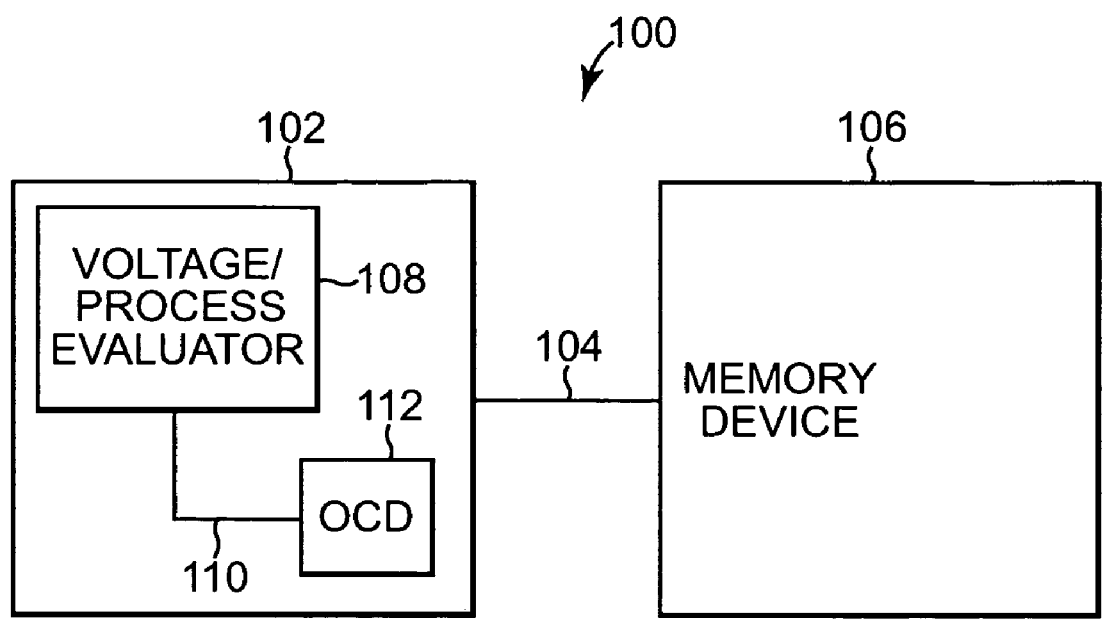
FIG. 1 is a block diagram illustrating one embodiment of a memory system having a voltage/process evaluation circuit.

FIG. 1 is a block diagram illustrating one embodiment of a memory system 100 having a voltage/process evaluation circuit. Memory system 100 includes a semiconductor chip 102 and a memory device 106. Semiconductor chip 102 is electrically coupled to memory device 106 through path 104. Semiconductor chip 102 includes voltage/process evaluation circuit 108 and off chip driver (OCD) circuit 112. Voltage/process evaluation circuit 108 is electrically coupled to OCD 112 through path 110. In one embodiment, semiconductor chip 102 includes a receiver circuit, generator circuit, a set up and hold time adjustment circuit, or any other suitable circuit. In one embodiment, memory device 106 and semiconductor chip 102 are a single semiconductor chip.

Voltage/process evaluation circuit 108 evaluates the incoming voltage supplied to chip 102 and the process of a negative channel field effect transistor (nFET) and a positive channel field effect transistor (pFET) in chip 102. The nFET and pFET that are evaluated are representative of all the nFETs and pFETs in chip 102. The evaluation results are passed to portions of OCD 112 through path 110. Based on the evaluation results, portions of OCD 112 are adjusted such that chip 102 meets specified specifications.

Voltage/process evaluation circuit 108 utilizes a number of circuits to perform the evaluations. A test circuit is used to evaluate the external voltage supplied to chip 102. The supplied voltage is converted into a delayed clock signal, where the delay is proportional to the value of the supplied voltage. A reference voltage representing a nominal value for the supplied voltage is also converted into a delayed clock signal, where the delay is proportional to the value of the reference voltage. The delay proportional to the supplied voltage is compared to the delay proportional to the reference voltage to compare the supplied voltage to the reference voltage.

Voltage/process evaluation circuit 108 also includes test circuits to evaluate the processes for the nFETs and pFETs in chip 102. The test circuits provide test voltages indicative of the processes for the FETs. The test voltages are converted into delayed clock signals, where the delays are proportional to the values of the test voltages. Reference voltages representing nominal values for the test voltages are also converted into delayed clock signals, where the delays are proportional to the reference voltages. The delays proportional to the FET processes are compared to the delays proportional to the reference voltages to compare the processes for the FETS to the reference values.

By converting the test voltages and reference voltages to delays rather than comparing them directly using comparators, power is conserved and process detection and evaluation is completed more quickly than if comparators were used. This voltage and process evaluation can occur each time chip 102 is reset or whenever desired.

Memory device 106 includes a dynamic random access memory (DRAM), synchronous dynamic random access memory (SDRAM), double data rate (DDR) SDRAM, or other suitable memory. Memory device 106 communicates with chip 102 through path 104.

Figure 2:
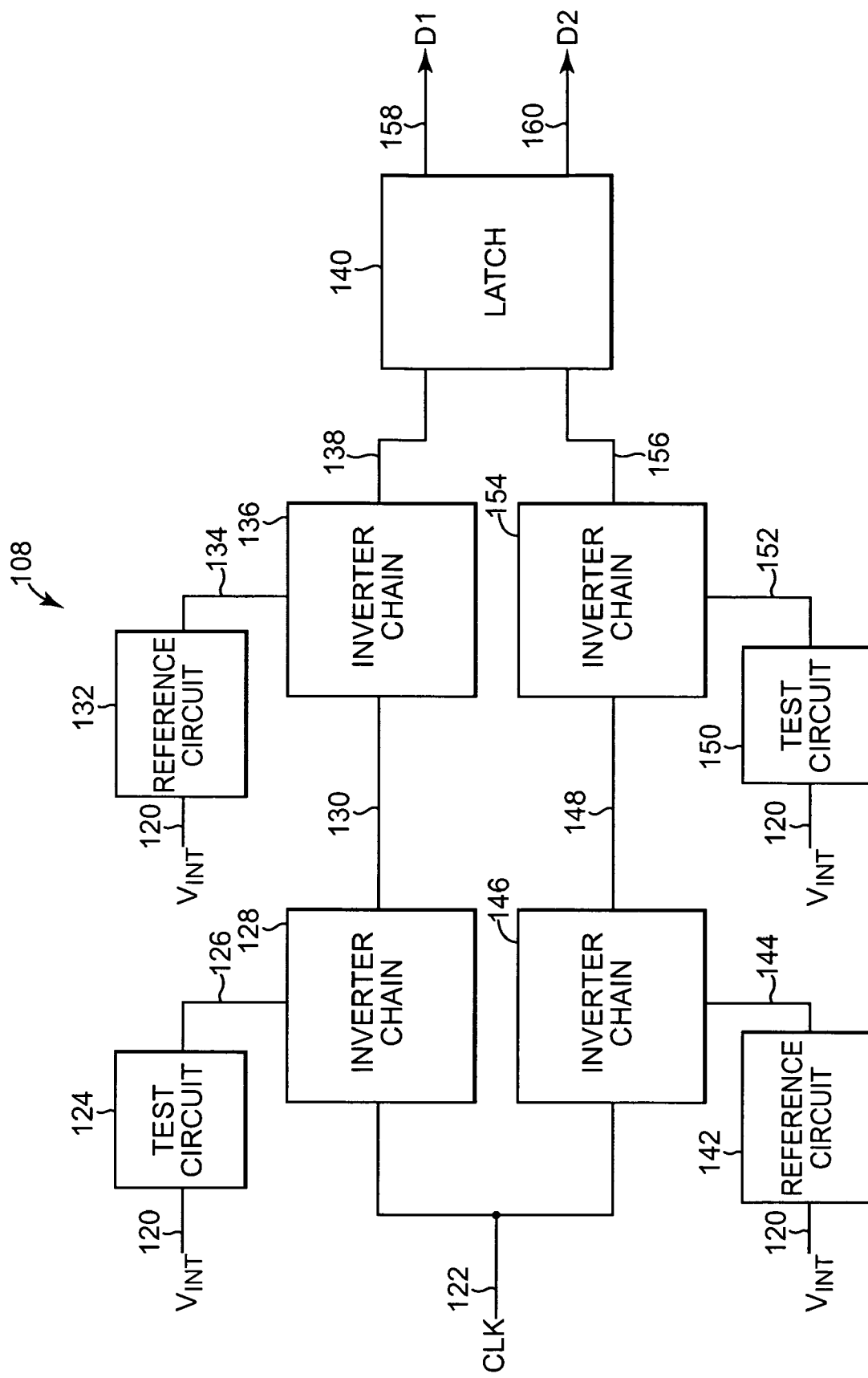
FIG. 2 is a block diagram illustrating one embodiment of a voltage/process evaluation circuit.

FIG. 2 is a block diagram illustrating one embodiment of voltage/process evaluation circuit 108. Voltage/process evaluation circuit 108 includes test circuits 124 and 150, reference circuits 132 and 142, inverter chains 128, 136, 146, and 154, and latch 140.

Test circuit 124 is electrically coupled to internal voltage ($V_{INT}$) signal path 120 and inverter chain 128 through signal path 126. Inverter chain 128 is electrically coupled to inverter chain 146 through clock (CLK) signal path 122 and inverter chain 136 through signal path 130. Inverter chain 136 is electrically coupled to reference circuit 132 through signal path 134 and latch 140 through signal path 138. Reference circuit 132 is electrically coupled to $V_{INT}$ signal path 120. Inverter chain 146 is electrically coupled to reference circuit 142 through signal path 144 and inverter chain 154 through signal path 148. Reference circuit 142 is electrically coupled to $V_{INT}$ signal path 120. Inverter chain 154 is electrically coupled to test circuit 150 through signal path 152 and latch 140 through signal path 156. Test circuit 150 is electrically coupled to $V_{INT}$ signal path 120. Latch 140 is electrically coupled to latch data one (D1) signal path 158 and latch data two (D2) signal path 160. In one embodiment, inverter chains 128, 136, 146, and 154 are current starved inverter chains.

The $V_{INT}$ signal is a voltage signal supplied by an external voltage source, internal voltage source, or other suitable voltage source. Test circuit 124 receives the $V_{INT}$ signal on $V_{INT}$ signal path 120 as an input and outputs a test voltage proportional to $V_{INT}$ to inverter chain 128 through signal path 126. The test voltage is received by inverter chain 128 and controls inverter chain 128. Inverter chain 128 receives the CLK signal through CLK signal path 122 as an input. Based on the test voltage received from test circuit 124, the CLK signal is delayed as it propagates through inverter chain 128. Inverter chain 128 outputs a delayed clock signal, which is proportional to the test voltage received from test circuit 124, to inverter chain 136 through signal path 130.

Reference circuit 142 receives the $V_{INT}$ voltage on $V_{INT}$ signal path 120 as an input and outputs a reference voltage to inverter chain 146 through signal path 144. In one embodiment, the reference voltage is a nominal voltage for the test voltage. The reference voltage is received by inverter chain 146 and controls inverter chain 146. Inverter chain 146 receives the CLK signal through CLK signal path 122 as an input. Based on the reference voltage received from reference circuit 142, the CLK signal is delayed as it propagates through inverter chain 146. Inverter chain 146 outputs a delayed clock signal, which is proportional to the reference voltage received from reference circuit 142, to inverter chain 154 through signal path 148.

Reference circuit 132 receives the $V_{INT}$ signal on $V_{INT}$ signal path 120 as an input and outputs a reference voltage to inverter chain 136 through signal path 134. In one embodiment, the reference voltage is a voltage indicating a nominal process for either an nFET or pFET. The reference voltage is received by inverter chain 136 and controls inverter chain 136. Inverter chain 136 receives the delayed clock signal from inverter chain 128 through signal path 130 as an input. Based on the reference voltage received from reference circuit 132, the delayed clock signal is further delayed as it propagates through inverter chain 136. Inverter chain 136 outputs a delayed clock signal, which is proportional to both the test voltage received from test circuit 124 and the reference voltage received from reference circuit 132, to latch 140 through signal path 138.

Test circuit 150 receives the $V_{INT}$ signal on $V_{INT}$ signal path 120 as an input and outputs a test voltage to inverter chain 154 through signal path 152. In one embodiment, the test voltage is indicative of the process for a pFET or nFET. The test voltage is received by inverter chain 154 and controls inverter chain 154. Inverter chain 154 receives the delayed clock signal from inverter chain 146 through signal path 148 as an input. Based on the test voltage received from test circuit 150, the delayed clock signal is further delayed as it propagates through inverter chain 154. Inverter chain 154 outputs a delayed clock signal, which is proportional to both the reference voltage received from reference circuit 142 and the test voltage received from test circuit 152, to latch 140 through signal path 156.

Latch 140 receives the delayed clock signal from inverter chain 136 through signal path 138 and the delayed clock signal from inverter chain 154 through signal path 156. If the rising edge of the delayed clock signal on signal path 138 arrives to the input of latch 140 before the rising edge of the delayed clock signal on signal path 156, latch 140 outputs a logic high level signal on D1 signal path 158 and a logic low level signal on D2 signal path 160. If the rising edge of the delayed clock signal on signal path 156 arrives to the input of latch 140 before the rising edge of the delayed clock signal on signal path 138, latch 140 outputs a logic low level signal on D1 signal path 158 and a logic high level signal on D2 signal path 160. Latch 140 maintains the output signals on D1 signal path 158 and D2 signal path 160 until another evaluation is performed.

The length of inverter chains 128, 136, 146, and 154 are set such that the effect of the supplied voltage and the process of an nFET or pFET on semiconductor chip 102 can be balanced for evaluation.

Figure 3A:
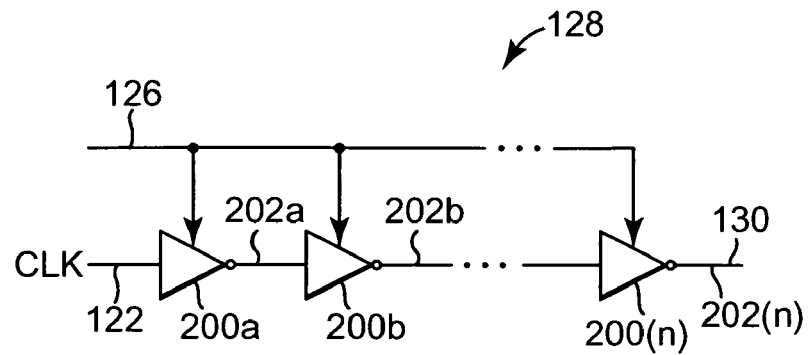
FIGS. 3a and 3b are schematic diagrams illustrating one embodiment of a current starved inverter chain.
Figure 3B:
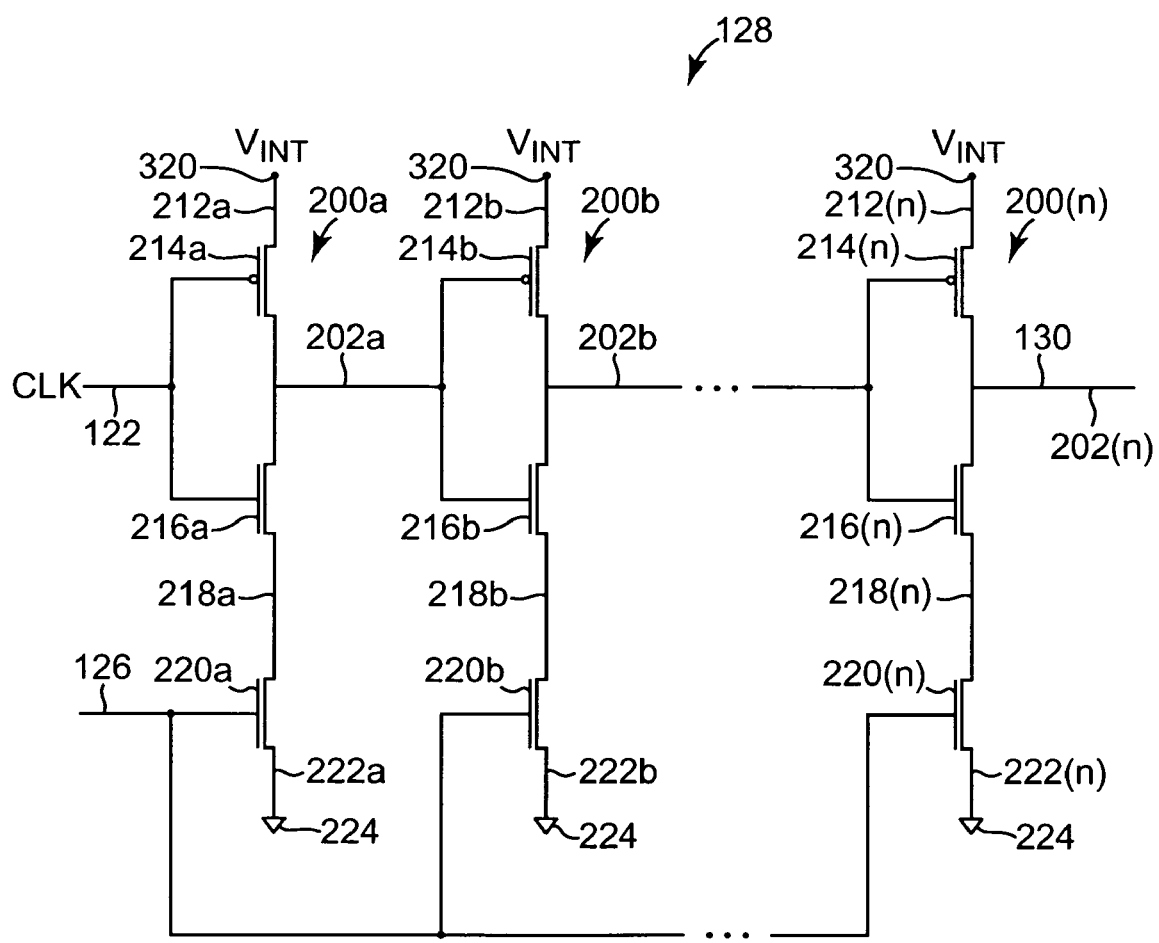

FIGS. 3a and 3b are schematic diagrams illustrating one embodiment of current starved inverter chain 128. Inverter chains 136, 146, and 154 are similar to inverter chain 128. As illustrated in FIG. 3a, inverter chain 128 includes inverters 200a-200(n). The CLK signal on CLK signal path 122 is electrically coupled to the input of inverter 200a. The output of inverter 200a is electrically coupled to the input of inverter 200b through path 202a. The output of inverter 200b is electrically coupled to the next inverter in inverter chain 128 through path 202b, etc., until the input of the last inverter 200(n) in inverter chain 128 is coupled to the output of the previous inverter in inverter chain 128. The output of inverter 200(n) is electrically coupled to path 202(n), which is the same as signal path 130. The controlling inputs of inverters 200a-200(n) are electrically coupled to signal path 126. The length of inverter chain 128 is based on the desired length of the delay for the CLK signal. The CLK signal on CLK signal path 122 is delayed as it propagates through each inverter 200a-200(n) in proportion to the test voltage on signal path 126.

FIG. 3b illustrates inverter chain 128 in more detail. Inverter 200a includes transistors 214a, 216a, and 220a. Inverter 200b includes transistors 214b, 216b, and 220b. Inverter 200(n) includes transistors 214(n), 216(n), and 220(n). Transistors 214a-214(n) are pFETs and transistors 216a-216(n) and 220a-220(n) are nFETs.

$V_{INT}$ 320 is electrically coupled to one side of the source-drain path of transistor 214a through path 212a. The other side of the source-drain path of transistor 214a is electrically coupled to one side of the source-drain path of transistor 216a and the gates of transistors 214b and 216b through path 202a. The gate of transistor 214a and the gate of transistor 216a are electrically coupled to CLK signal path 122. The other side of the source-drain path of transistor 216a is electrically coupled to one side of the source-drain path of transistor 220a through path 218a. The other side of the source-drain path of transistor 220a is electrically coupled to ground or common 224 through path 222a. The gate of transistor 220a is electrically coupled to the gates of transistors 220b-220(n) through signal path 126.

$V_{INT}$ 320 is electrically coupled to one side of the source-drain path of transistor 214b through path 212b. The other side of the source-drain path of transistor 214b is electrically coupled to one side of the source-drain path of transistor 216b and the gates of the next transistor 214 and transistor 216 in inverter chain 128. The other side of the source-drain path of transistor 216b is electrically coupled to one side of the source-drain path of transistor 220b through path 218b. The other side of the source-drain path of transistor 220b is electrically coupled to ground or common 224 through path 222b.

$V_{INT}$ 320 is electrically coupled to one side of the source-drain path of transistor 214(n) through path 212(n). The other side of the source-drain path of transistor 214(n) is electrically coupled to signal path 202(n), which is the same as signal path 130, and one side of the source-drain source path of transistor 216(n). The other side of the source-drain path of transistor 216(n) is electrically coupled to one side of the source-drain path of transistor 220(n) through path 218(n). The other side of the source-drain path of transistor 220(n) is electrically coupled to common or ground 224 through path 222(n).

Inverters 200a-200(n) are current starved inverters controlled by the test voltage from test circuit 124 through signal path 126. The CLK signal on CLK signal path 122 is delayed as it propagates through inverters 200a-200(n). The delay of the CLK signal through inverters 200a-200(n) is proportional to the test voltage on signal path 126 applied to the gates of transistors 220a-220(n). Inverter chains 136, 146, and 154 operate in a similar manner as inverter chain 128.

FIG. 4 is a schematic diagram illustrating one embodiment of latch 140. Latch 140 includes NAND gates 300, 304, 306, and 310. One input of NAND gate 300 is electrically coupled to signal path 138 and the other input of NAND gate 300 is electrically coupled to the output of NAND gate 306 and one input of NAND gate 310 through path 308. The output of NAND gate 300 is electrically coupled to one input of NAND gate 304 and one input of NAND gate 306 through path 302. The other input of NAND gate 306 is electrically coupled to signal path 156. The output of NAND gate 304 is electrically coupled to the other input of NAND gate 310 through D1 signal path 158. The output of NAND gate 310 is electrically coupled to the other input of NAND gate 304 through D2 signal path 160.

In operation, if a rising edge of the delayed clock signal on signal path 138 arrives to the input of NAND gate 300 before a rising edge of the delayed clock signal on signal path 156 arrives to the input of NAND gate 306, the output on D1 signal path 158 transitions to a logic high level and the output on D2 signal path 160 transitions to a logic low level. If a rising edge of the delayed clock signal on signal path 156 arrives to the input of NAND gate 306 before a rising edge of the delayed clock signal on signal path 138 arrives to the input of NAND gate 300, the output on D2 signal path 160 transitions to a logic high level and the output on D1 signal path 158 transitions to a logic low level. The signals on D1 signal path 158 and D2 signal path 160 will remain constant until another evaluation is performed.

FIG. 5 is a schematic diagram illustrating one embodiment of test circuit 124 for evaluating a supplied voltage. Test circuit 124 includes resistor 322 and resistor 324. Resistor 322 is electrically coupled to $V_{INT}$ 320 through path 321 and resistor 324 through divided voltage ($V_{DIV}$) signal path 126. Resistor 324 is electrically coupled to common or ground 224 through path 326.

In operation, test circuit 124 receives the $V_{INT}$ signal, which is supplied by an external circuit to semiconductor chip 102, and divides the $V_{INT}$ between resistor 322 and 324. Test circuit 124 outputs the $V_{DIV}$ signal on signal path 126 to inverter chain 128. The $V_{DIV}$ signal is proportional to the $V_{INT}$ signal.

FIG. 6 is a schematic diagram illustrating one embodiment of reference circuit 142 for evaluating a supplied voltage. Reference circuit 142 includes voltage source 328. Voltage source 328 is electrically coupled to reference voltage ($V_{REF}$) signal path 144 and common or ground 224 through path 330. Reference circuit 142 provides a reference voltage, $V_{REF}$, which indicates a nominal value for the supplied voltage for comparison to the $V_{DIV}$ signal from test circuit 124.

Figure 7:
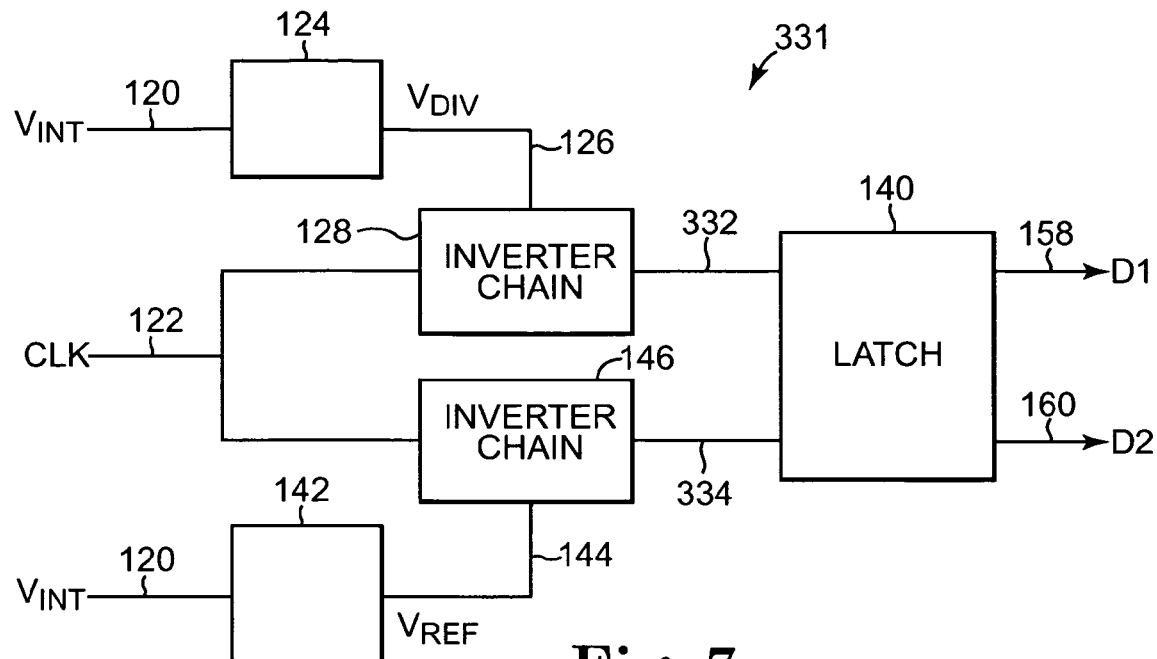
FIG. 7 is a block diagram illustrating one embodiment of an evaluation circuit for evaluating a supplied voltage.

FIG. 7 is a block diagram illustrating one embodiment of an evaluation circuit 331 for evaluating a supplied voltage. Supplied voltage evaluation circuit 331 includes test circuit 124, reference circuit 142, inverter chains 128 and 146, and latch 140. Test circuit 124 is electrically coupled to $V_{INT}$ signal path 120 and inverter chain 128 through $V_{DIV}$ signal path 126. Reference circuit 142 is electrically coupled to $V_{INT}$ signal path 120 and inverter chain 146 through $V_{REF}$ signal path 144. Clock signal path 122 is electrically coupled to inverter chain 128 and inverter chain 146. Latch 140 is electrically coupled to inverter chain 128 through signal path 332, inverter chain 146 through signal path 334, D1 signal path 158, and D2 signal path 160. Signal path 332 is similar to signal path 138 and signal path 334 is similar to signal path 156 of latch 140 illustrated in FIG. 4.

Test circuit 124 receives the $V_{INT}$ signal on $V_{INT}$ signal path 120 as an input and outputs the $V_{DIV}$ signal to inverter chain 128 through signal path 126. The $V_{DIV}$ signal is received by inverter chain 128 and controls inverter chain 128. Inverter chain 128 receives the CLK signal through CLK signal path 122 as an input. Based on the $V_{DIV}$ signal received from test circuit 124, the CLK signal is delayed as it propagates through inverter chain 128. Inverter chain 128 outputs a delayed clock signal, which is proportional to the $V_{DIV}$ signal received from test circuit 124, to latch 140 through signal path 332.

Reference circuit 142 receives the $V_{INT}$ voltage on $V_{INT}$ signal path 120 as an input and outputs the $V_{REF}$ signal to inverter chain 146 through signal path 144. In one embodiment, the $V_{REF}$ signal is a nominal voltage for the $V_{DIV}$ signal. The $V_{REF}$ signal is received by inverter chain 146 and controls inverter chain 146. Inverter chain 146 receives the CLK signal through CLK signal path 122 as an input. Based on the $V_{REF}$ signal received from reference circuit 142, the CLK signal is delayed as it propagates through inverter chain 146. Inverter chain 146 outputs a delayed clock signal, which is proportional to the $V_{REF}$ signal received from reference circuit 142, to latch 140 through path 334.

Latch 140 receives the delayed clock signal from inverter chain 128 through signal path 332 and the delayed clock signal from inverter chain 146 through signal path 334. If the rising edge of the delayed clock signal on signal path 332 arrives to the input of latch 140 before the rising edge of the delayed clock signal on signal path 334, latch 140 outputs a logic high level signal on D1 signal path 158 and a logic low level signal on D2 signal path 160. If the rising edge of the delayed clock signal on signal path 334 arrives to the input of latch 140 before the rising edge of the delayed clock signal on signal path 332, latch 140 outputs a logic low level signal on D1 signal path 158 and a logic high level signal on D2 signal path 160. Latch 140 maintains the output signals on D1 signal path 158 and D2 path 160 until another evaluation is performed.

If $V_{DIV}$ is greater than $V_{REF}$, which indicates the supplied voltage is greater than the nominal voltage, then a logic high level signal is latched on D1 signal path 158 and a logic low level signal is latched on D2 signal path 160. If $V_{DIV}$ is less than $V_{REF}$, which indicates the supplied voltage is less than the nominal voltage, then a logic low level signal is latched on D1 signal path 158 and a logic high level signal is latched on D2 signal path 160.

Figures 8, 9:
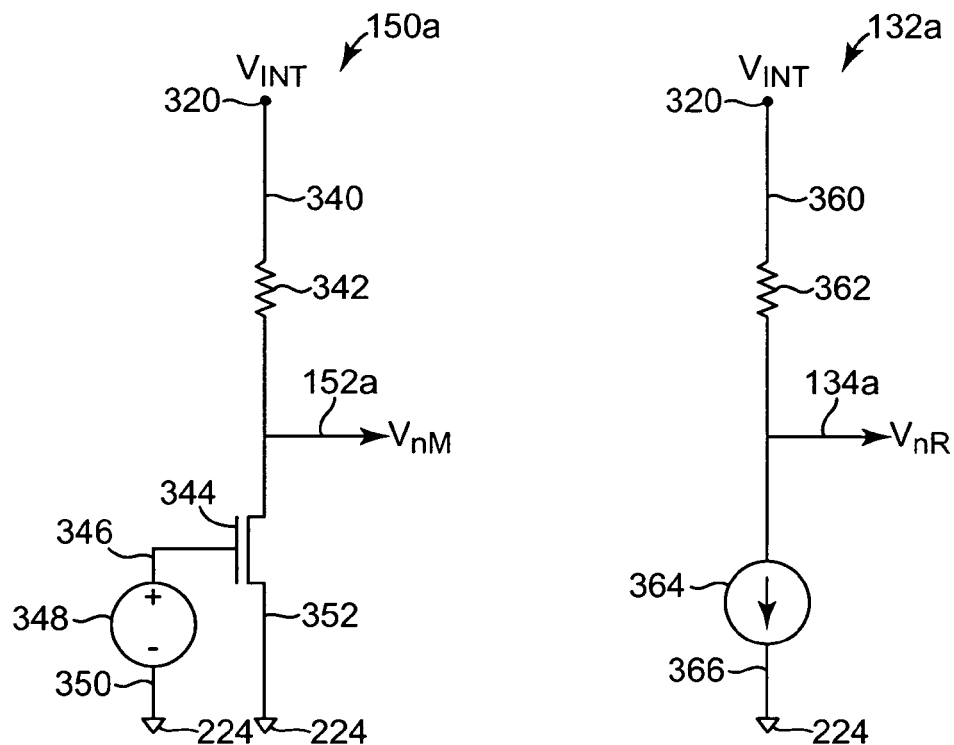
FIG. 8 is a schematic diagram illustrating one embodiment of a test circuit for evaluating the process of a negative channel field effect transistor (nFET).
FIG. 9 is a schematic diagram illustrating one embodiment of a reference circuit for evaluating the process of an nFET.

FIG. 8 is a schematic diagram illustrating one embodiment of test circuit 150, indicated as test circuit 150a, for evaluating the process of an nFET. Test circuit 150a includes resistor 342, transistor 344, and voltage source 348. Transistor 344 is an nFET. Resistor 342 is electrically coupled to $V_{INT}$ 320 through path 340 and one side of the source-drain path of transistor 344 through $V_{nM}$ signal path 152a. The other side of the source-drain path of transistor 344 is electrically coupled to common or ground 224 through path 352. The gate of transistor 344 is electrically coupled to voltage source 348 through path 346. Voltage source 348 is electrically coupled to common or ground 224 through path 350.

Voltage source 348 provides a voltage to the gate of transistor 344 to turn transistor 344 on (conducting). $V_{INT}$ voltage 320 is divided between resistor 342 and the source-drain path of transistor 344 to output a voltage, $V_{nM}$, on $V_{nM}$ signal path 152a. The $V_{nM}$ voltage on $V_{nM}$ signal path 142a is indicative of the process for transistor 344. Transistor 344 is representative of all nFET transistors of semiconductor chip 102.

FIG. 9 is a schematic diagram illustrating one embodiment of reference circuit 132, indicated as reference circuit 132a, for evaluating the process of an nFET. Reference circuit 132a includes resistor 362 and current source 364. Resistor 362 is electrically coupled to $V_{INT}$ 320 through path 360 and current source 364 through $V_{nR}$ signal path 134a. Current source 364 is electrically coupled to common or ground 224 through path 366. The resistance of resistor 362 is substantially equal to the resistance of resistor 342.

Reference circuit 134a provides a reference voltage output on $V_{nR}$ signal path 134a for comparison to the $V_{nM}$ voltage on signal path 152a. The voltage on $V_{nR}$ signal path 134a indicates a nominal process for transistor 344.

Figure 10:
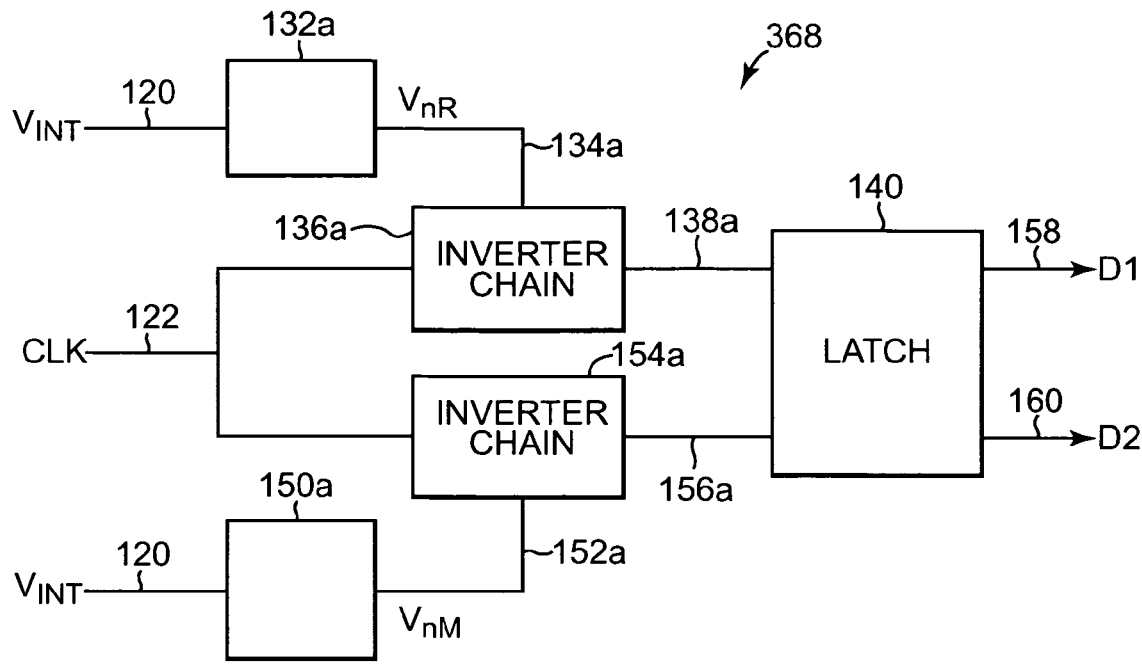
FIG. 10 is a block diagram illustrating one embodiment of an evaluation circuit for evaluating the process of an nFET.

FIG. 10 is a block diagram illustrating one embodiment of an evaluation circuit 368 for evaluating the process for nFET 344. Evaluation circuit 368 includes reference circuit 132a, test circuit 150a, inverter chains 136a and 154a, and latch 140. Reference circuit 132a is electrically coupled to $V_{INT}$ signal path 120 and inverter chain 136a through $V_{nR}$ signal path 134a. Test circuit 150a is electrically coupled to $V_{INT}$ signal path 120 and inverter chain 154a through $V_{nM}$ signal path 152a. Clock signal path 122 is electrically coupled to inverter chain 136a and inverter chain 154a. Latch 140 is electrically coupled to inverter chain 136a through signal path 138a, inverter chain 154a through signal path 156a, D1 signal path 158, and D2 signal path 160.

Reference circuit 132a receives the $V_{INT}$ voltage on $V_{INT}$ signal path 120 as an input and outputs the $V_{nR}$ signal to inverter chain 136a through signal path 134a. In one embodiment, the $V_{nR}$ signal is a nominal voltage for the $V_{nM}$ signal. The $V_{nR}$ signal is received by inverter chain 136a and controls inverter chain 136a. Inverter chain 136a receives the CLK signal through CLK signal path 122 as an input. Based on the $V_{nR}$ signal received from reference circuit 132a, the CLK signal is delayed as it propagates through inverter chain 136a. Inverter chain 136a outputs a delayed clock signal, which is proportional to the $V_{nR}$ signal received from reference circuit 132a, to latch 140 through signal path 138a.

Test circuit 150a receives the $V_{INT}$ signal on $V_{INT}$ signal path 120 as an input and outputs the $V_{nM}$ signal to inverter chain 154a through signal path 152a. The $V_{nM}$ signal is received by inverter chain 154a and controls inverter chain 154a. Inverter chain 154a receives the CLK signal through CLK signal path 122 as an input. Based on the $V_{nM}$ signal received from test circuit 150a, the CLK signal is delayed as it propagates through inverter chain 154a. Inverter chain 154a outputs a delayed clock signal, which is proportional to the $V_{nM}$ signal received from test circuit 150a, to latch 140 through signal path 156a.

Latch 140 receives the delayed clock signal from inverter chain 136a through signal path 138a and the delayed clock signal from inverter chain 154a through signal path 156a. If the rising edge of the delayed clock signal on signal path 138a arrives to the input of latch 140 before the rising edge of the delayed clock signal on signal path 156a, latch 140 outputs a logic high level signal on D1 signal path 158 and a logic low level signal on D2 signal path 160. If the rising edge of the delayed clock signal on signal path 156a arrives to the input of latch 140 before the rising edge of the delayed clock signal on signal path 138a, latch 140 outputs a logic low level signal on D1 signal path 158 and a logic high level signal on D2 signal path 160. Latch 140 maintains the output signals on D1 signal path 158 and D2 signal path 160 until another evaluation is performed.

If $V_{nM}$ is greater than $V_{nR}$, which indicates the process of nFET 344 is slower than nominal, then a logic low level signal is latched on D1 signal path 158 and a logic high level signal is latched on D2 signal path 160. If $V_{nM}$ is less than $V_{nR}$, which indicates the process of nFET 344 is faster than nominal, then a logic high level signal is latched on D1 signal path 158 and a logic low level signal is latched on D2 signal path 160.

Figures 11, 12:
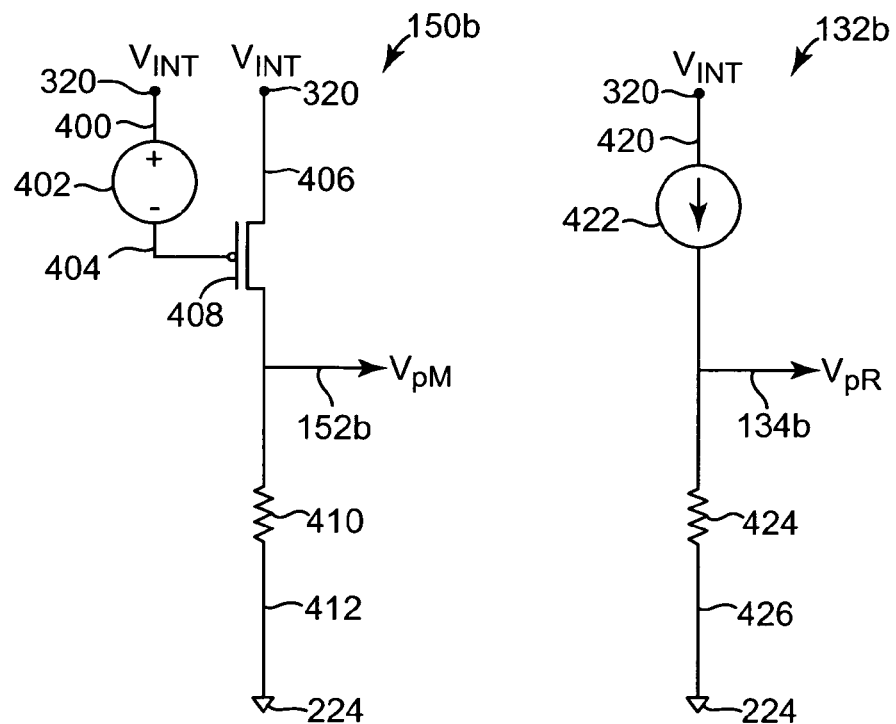
FIG. 11 is a schematic diagram illustrating one embodiment of a test circuit for evaluating the process of a positive channel field effect transistor (pFET).
FIG. 12 is a schematic diagram illustrating one embodiment of a reference circuit for evaluating the process of a pFET.

FIG. 11 is a schematic diagram illustrating another embodiment of a test circuit 150, indicated as test circuit 150b, for evaluating the process of a pFET. Test circuit 150b includes voltage source 402, transistor 408, and resistor 410. Transistor 408 is a pFET. Voltage source 402 is electrically coupled to $V_{INT}$ 320 through path 400 and the gate of transistor 408 through path 404. One side of the source-drain path of transistor 408 is electrically coupled to $V_{INT}$ 320 through path 406. The other side of the source-drain path of transistor 408 is electrically coupled to resistor 410 thorough $V_{pM}$ signal path 152b. Resistor 410 is electrically coupled to common or ground 224 through path 412.

Voltage source 402 provides a voltage to the gate of transistor 408 to turn transistor 408 on (conducting). $V_{INT}$ 320 is divided between the source-drain path of transistor 408 and resistor 410 to output a voltage $V_{pM}$, on $V_{pM}$ signal path 152b. The $V_{pM}$ voltage on $V_{pM}$ signal path 152b is indicative of the process for transistor 408. Transistor 408 is representative of all pFET transistors of semiconductor chip 102.

FIG. 12 is a schematic diagram illustrating another embodiment of reference circuit 132, indicated as reference circuit 132b, for evaluating the process of a pFET. Reference circuit 132b includes current source 422 and resistor 424. Current source 422 is electrically coupled to $V_{INT}$ 320 through path 420 and resistor 424 through $V_{pR}$ signal path 134b. Resistor 424 is electrically coupled to common or ground 224 through path 426. The resistance of resistor 424 is substantially equal to the resistance of resistor 410.

Reference circuit 132b provides a reference voltage output on $V_{pR}$ signal path 134b for comparison to the $V_{pM}$ voltage on signal path 152b. The voltage on $V_{pR}$ signal path 134b indicates a nominal process for transistor 408.

Figure 13:
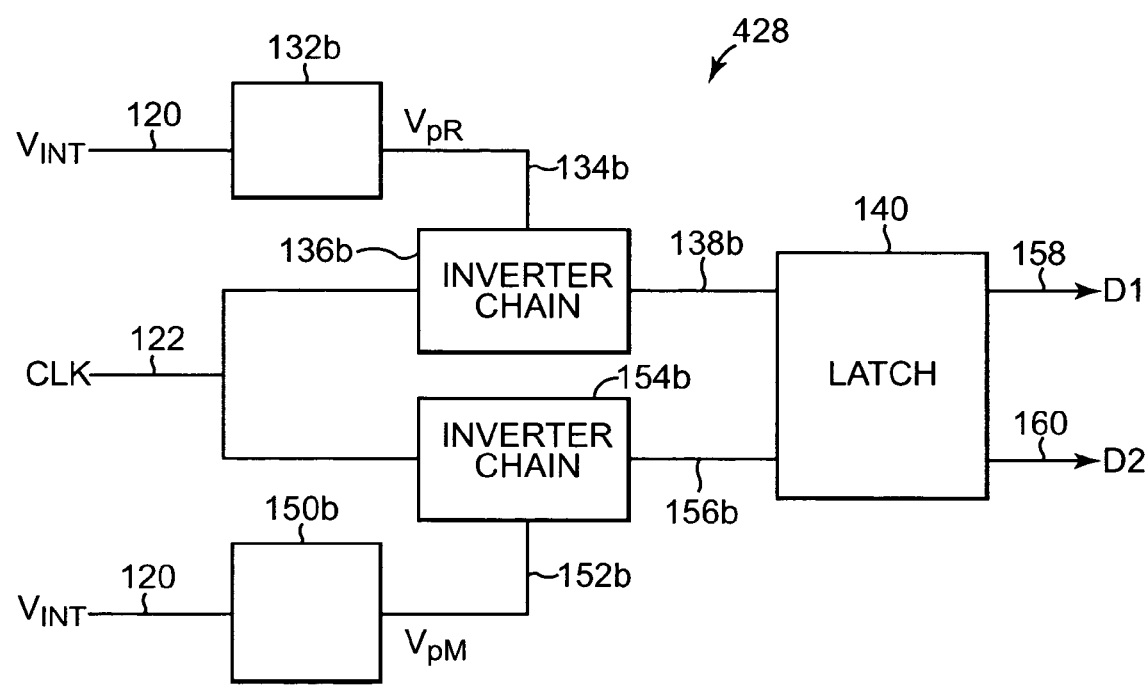
FIG. 13 is a block diagram illustrating one embodiment of an evaluation circuit for evaluating the process of a pFET.

FIG. 13 is a block diagram illustrating one embodiment of an evaluation circuit 428 for evaluating the process for pFET 408. Evaluation circuit 428 includes reference circuit 132b, test circuit 150b, inverter chains 136b and 154b, and latch 140.

Reference circuit 132b is electrically coupled to $V_{INT}$ signal path 120 and inverter chain 136b through $V_{pR}$ signal path 134b. Test circuit 150b is electrically coupled to $V_{INT}$ signal path 120 and inverter chain 154b through $V_{pM}$ signal path 152b. CLK signal path 122 is electrically coupled to inverter chain 134b and inverter chain 154b. Latch 140 is electrically coupled to inverter chain 136b through signal path 138b, inverter chain 154b through signal path 156b, D1 signal path 158, and D2 signal path 160.

Reference circuit 132b receives the $V_{INT}$ voltage on $V_{INT}$ signal path 120 as an input and outputs the $V_{pR}$ signal to inverter chain 136b through signal path 134b. In one embodiment, the $V_{pR}$ signal is a nominal voltage for the $V_{pM}$ signal. The $V_{pR}$ signal is received by inverter chain 136b and controls inverter chain 136b. Inverter chain 136b receives the CLK signal through CLK signal path 122 as an input. Based on the $V_{pR}$ signal received from reference circuit 132b, the CLK signal is delayed as it propagates through inverter chain 136b. Inverter chain 136b outputs a delayed clock signal, which is proportional to the $V_{pR}$ signal received from reference circuit 132b, to latch 140 through signal path 138b.

Test circuit 150b receives the $V_{INT}$ signal on $V_{INT}$ signal path 120 as an input and outputs the $V_{pM}$ signal to inverter chain 154b through signal path 152b. The $V_{pM}$ signal is received by inverter chain 154b and controls inverter chain 154b. Inverter chain 154b receives the CLK signal through CLK signal path 122 as an input. Based on the $V_{pM}$ signal received from test circuit 150b, the CLK signal is delayed as it propagates through inverter chain 154b. Inverter chain 154b outputs a delayed clock signal, which is proportional to the $V_{pM}$ signal received from test circuit 150b, to latch 140 through signal path 156b.

Latch 140 receives the delayed clock signal from inverter chain 136b through signal path 138b and the delayed clock signal from inverter chain 154b through signal path 156b. If the rising edge of the delayed clock signal on signal path 138b arrives to the input of latch 140 before the rising edge of the delayed clock signal on signal path 156b, latch 140 outputs a logic high level signal on D1 signal path 158 and a logic low level signal on D2 signal path 160. If the rising edge of the delayed clock signal on signal path 156b arrives to the input of latch 140 before the rising edge of the delayed clock signal on signal path 138b, latch 140 outputs a logic low level signal on D1 signal path 158 and a logic high level signal on D2 signal path 160. Latch 140 maintains the output signals on D1 signal path 158 and D2 signal path 160 until another evaluation is performed.

If $V_{pM}$ is greater than $V_{pR}$, which indicates the process of pFET 408 is faster than nominal, then a logic low level signal is latched on D1 signal path 158 and a logic high level signal is latched on D2 signal path 160. If $V_{pM}$ is less than $V_{pR}$, which indicates the process of pFET 408 is slower than nominal, then a logic high level signal is latched on D1 signal path 158 and a logic low level signal is latched on D2 signal path 160.

Figure 14:
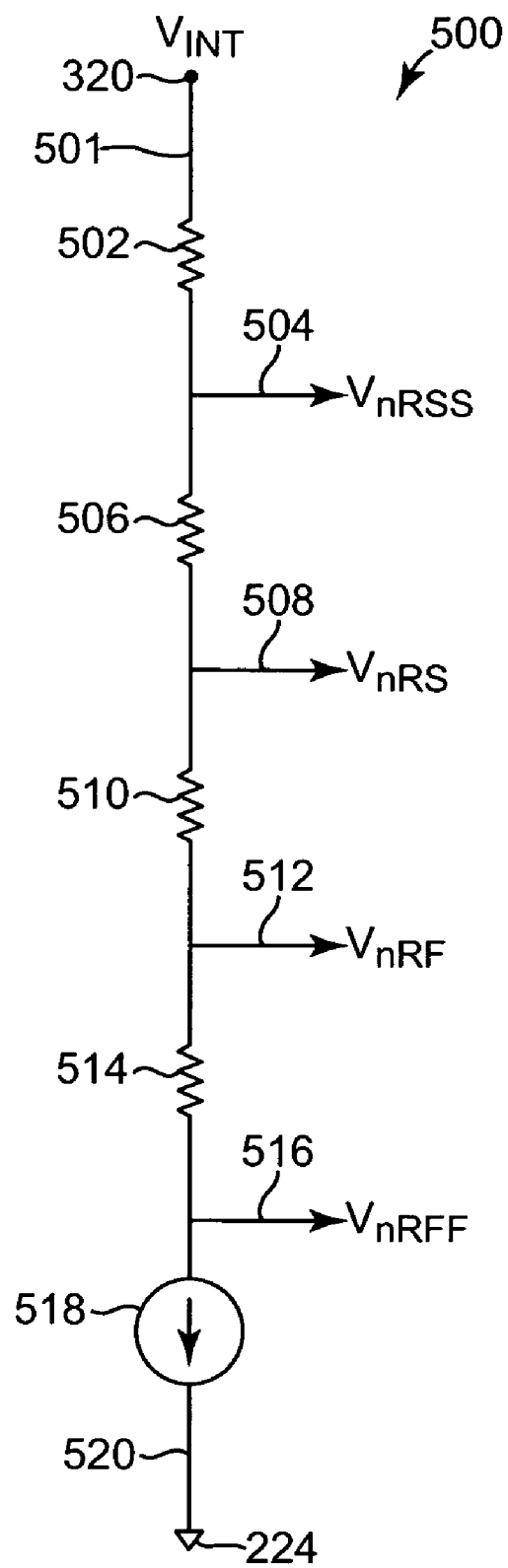
FIG. 14 is a schematic diagram illustrating one embodiment of a reference circuit for providing multiple reference signals for evaluating the process of an nFET.

FIG. 14 is a schematic diagram illustrating one embodiment of a reference circuit 500 for providing multiple reference signals for evaluating the process of an nFET. Reference circuit 500 includes resistors 502, 506, 510, and 514, and current source 518. Resistor 502 is electrically coupled to $V_{INT}$ 320 through path 501 and resistor 506 through slowest process nFET reference voltage ($V_{nRSS}$) signal path 504. Resistor 506 is electrically coupled to resistor 510 through slow process nFET reference voltage ($V_{nRS}$) signal path 508. Resistor 510 is electrically coupled to resistor 514 through fast process nFET reference voltage ($V_{nRF}$) signal path 512. Resistor 514 is electrically coupled to current source 518 through fastest process nFET reference voltage ($V_{nRFF}$) signal path 516. Current source 518 is electrically coupled to common or ground 224 through path 520. The sum of the resistances of resistors 502, 506, 510, and 514 is substantially equal to the resistance of resistor 342.

Reference circuit 500 provides four reference voltages to compare to $V_{nM}$ from test circuit 150a. $V_{nRSS}$ indicates the slowest process for nFET 344. $V_{nRS}$ indicates a slow process for nFET 344, but faster than $V_{nRSS}$. $V_{nRF}$ indicates a fast process for nFET 344 and $V_{nRFF}$ indicates the fastest process for nFET 344. In other embodiments, reference circuit 500 includes more than four resistors to provide more than four reference voltages. Any suitable number of resistors to provide any suitable number of reference voltages can be provided.

Figure 15:
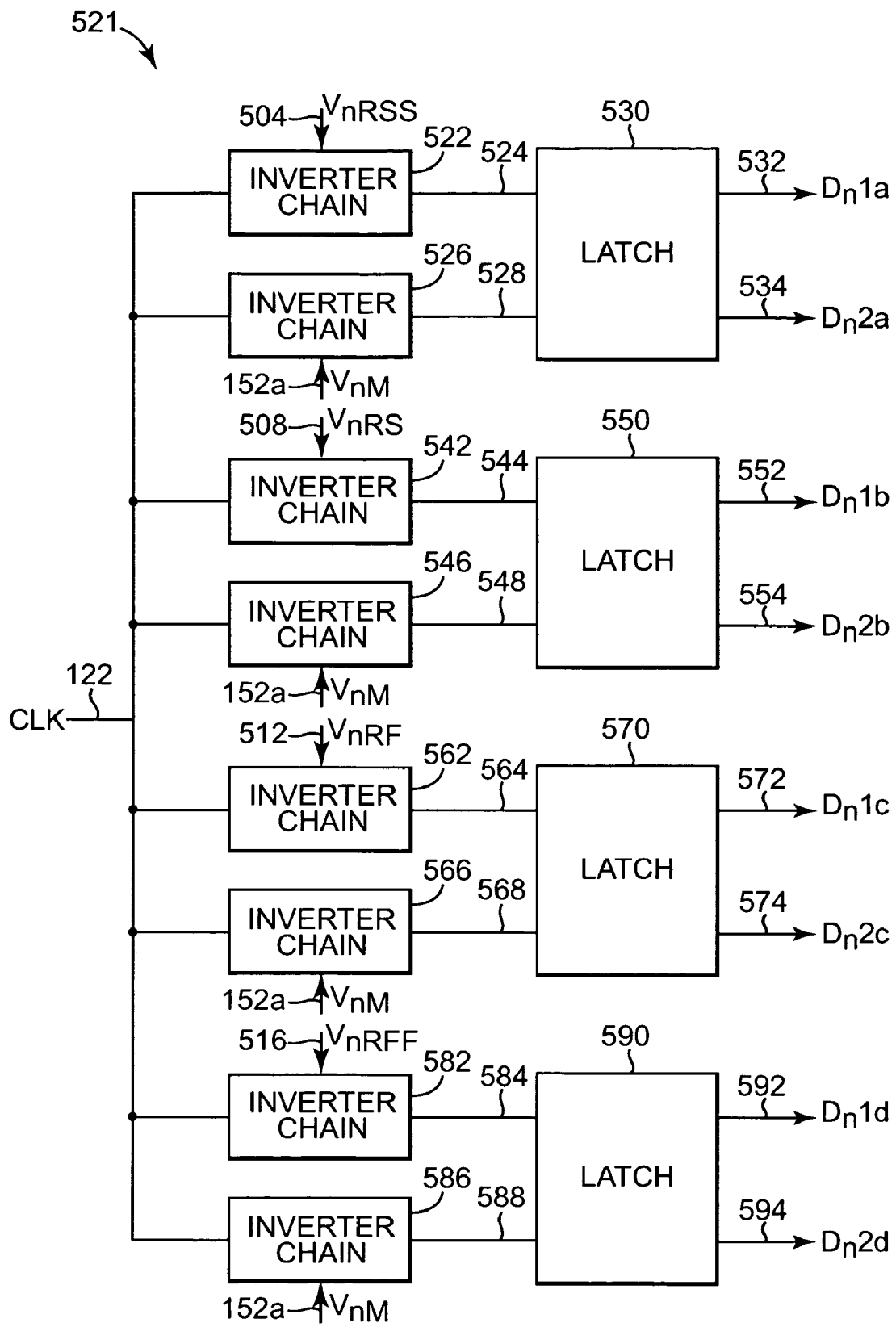
FIG. 15 is a block diagram illustrating one embodiment of an evaluation circuit having multiple latches for evaluating the process of an nFET.

FIG. 15 is a block diagram illustrating one embodiment of an evaluation circuit 521 having multiple latches for evaluating the process for nFET 344. Process evaluation circuit 521 includes inverter chains 522, 526, 542, 546, 562, 566, 582, and 586, and latches 530, 550, 570, and 590. In one embodiment, inverter chains 526, 546, 566, and 586, are replaced with a single inverter chain having an output coupled to latches 530, 550, 570, and 590. Inverter chains 522, 526, 542, 546, 562, 566, 582, and 586 are similar to inverter chain 128. Latches 530, 550, 570, and 590 are similar to latch 140.

Inverter chain 522 is electrically coupled to $V_{nRSS}$ signal path 504, CLK signal path 122, and latch 530 through signal path 524. Inverter chain 526 is electrically coupled to $V_{nM}$ signal path 152a, CLK signal path 122, and latch 530 through signal path 528. Latch 530 is electrically coupled to nFET latch A data one ($D_n1a$) signal path 532 and nFET latch A data two ($D_n2a$) signal path 534.

Inverter chain 542 is electrically coupled to $V_{nRS}$ signal path 508, CLK signal path 122, and latch 550 through signal path 544. Inverter chain 546 is electrically coupled to $V_{nM}$ signal path 152a, CLK signal path 122, and latch 550 through signal path 548. Latch 550 is electrically coupled to nFET latch B data one ($D_n1b$) signal path 552 and nFET latch B data two ($D_n2b$) signal path 554.

Inverter chain 562 is electrically coupled to $V_{nRF}$ signal path 512, CLK signal path 122, and latch 570 through signal path 564. Inverter chain 556 is electrically coupled to $V_{nM}$ signal path 152a, CLK signal path 122, and latch 570 through signal path 568. Latch 570 is electrically coupled to nFET latch C data one ($D_n1c$) signal path 572 and nFET latch C data two ($D_n2c$) signal path 574.

Inverter chain 582 is electrically coupled to $V_{nRFF}$ signal path 516, CLK signal path 122, and latch 590 through signal path 584. Inverter chain 586 is electrically coupled to $V_{nM}$ signal path 152a, CLK signal path 122, and latch 590 through signal path 588. Latch 590 is electrically coupled to nFET latch D data one ($D_n1d$) signal path 592 and nFET latch D data two ($D_n2d$) signal path 594.

Reference circuit 500 outputs the $V_{nRSS}$ signal to inverter chain 522 through signal path 504. The $V_{nRSS}$ signal is received by inverter chain 522 and controls inverter chain 522. Inverter chain 522 receives the CLK signal through CLK signal path 122 as an input. Based on the $V_{nRSS}$ signal received from reference circuit 500, the CLK signal is delayed as it propagates through inverter chain 522. Inverter chain 522 outputs a delayed clock signal, which is proportional to the $V_{nRSS}$ signal received from reference circuit 500, to latch 530 through signal path 524.

Test circuit 150a outputs the $V_{nM}$ signal to inverter chain 526 through signal path 152a. The $V_{nM}$ signal is received by inverter chain 526 and controls inverter chain 526. Inverter chain 526 receives the CLK signal through CLK signal path 122 as an input. Based on the $V_{nM}$ signal received from test circuit 150a, the CLK signal is delayed as it propagates through inverter chain 526. Inverter chain 526 outputs a delayed clock signal, which is proportional to the $V_{nM}$ signal received from test circuit 150a, to latch 530 through signal path 528.

Latch 530 receives the delayed clock signal from inverter chain 522 through signal path 524 and the delayed clock signal from inverter chain 526 through signal path 528. If the rising edge of the delayed clock signal on signal path 524 arrives to the input of latch 530 before the rising edge of the delayed clock signal on signal path 528, latch 530 outputs a logic high level signal on $D_n1a$ signal path 532 and a logic low level signal on $D_n2a$ signal path 534. If the rising edge of the delayed clock signal on signal path 528 arrives to the input of latch 530 before the rising edge of the delayed clock signal on signal path 524, latch 530 outputs a logic low level signal on $D_n1a$ signal path 532 and a logic high level signal on $D_n2a$ signal path 534. Latch 530 maintains the output signals on $D_n1a$ signal path 532 and $D_n2a$ signal path 534 until another evaluation is performed.

Reference circuit 500 outputs the $V_{nRS}$ signal to inverter chain 542 through signal path 508. The $V_{nRS}$ signal is received by inverter chain 542 and controls inverter chain 542. Inverter chain 542 receives the CLK signal through CLK signal path 122 as an input. Based on the $V_{nRS}$ signal received from reference circuit 500, the CLK signal is delayed as it propagates through inverter chain 542. Inverter chain 542 outputs a delayed clock signal, which is proportional to the $V_{nRS}$ signal received from reference circuit 500, to latch 550 through signal path 544.

Test circuit 150a outputs the $V_{nM}$ signal to inverter chain 546 through signal path 152a. The $V_{nM}$ signal is received by inverter chain 546 and controls inverter chain 546. Inverter chain 546 receives the CLK signal through CLK signal path 122 as an input. Based on the $V_{nM}$ signal received from test circuit 150a, the CLK signal is delayed as it propagates through inverter chain 546. Inverter chain 546 outputs a delayed clock signal, which is proportional to the $V_{nM}$ signal received from test circuit 150a, to latch 550 through signal path 548.

Latch 550 receives the delayed clock signal from inverter chain 542 through signal path 544 and the delayed clock signal from inverter chain 546 through signal path 548. If the rising edge of the delayed clock signal on signal path 544 arrives to the input of latch 550 before the rising edge of the delayed clock signal on signal path 548, latch 550 outputs a logic high level signal on $D_n1b$ signal path 552 and a logic low level signal on $D_n2b$ signal path 554. If the rising edge of the delayed clock signal on signal path 548 arrives to the input of latch 550 before the rising edge of the delayed clock signal on signal path 544, latch 550 outputs a logic low level signal on $D_n1b$ signal path 552 and a logic high level signal on $D_n2b$ signal path 554. Latch 550 maintains the output signals on $D_n1b$ signal path 552 and $D_n2b$ signal path 554 until another evaluation is performed.

Reference circuit 500 outputs the $V_{nRF}$ signal to inverter chain 562 through signal path 512. The $V_{nRF}$ signal is received by inverter chain 562 and controls inverter chain 562. Inverter chain 562 receives the CLK signal through CLK signal path 122 as an input. Based on the $V_{nRF}$ signal received from reference circuit 500, the CLK signal is delayed as it propagates through inverter chain 562. Inverter chain 562 outputs a delayed clock signal, which is proportional to the $V_{nRF}$ signal received from reference circuit 500, to latch 570 through signal path 564.

Test circuit 150a outputs the $V_{nM}$ signal to inverter chain 566 through signal path 152a. The $V_{nM}$ signal is received by inverter chain 566 and controls inverter chain 566. Inverter chain 566 receives the CLK signal through CLK signal path 122 as an input. Based on the $V_{nM}$ signal received from test circuit 150a, the CLK signal is delayed as it propagates through inverter chain 566. Inverter chain 566 outputs a delayed clock signal, which is proportional to the $V_{nM}$ signal received from test circuit 150a, to latch 570 through signal path 568.

Latch 570 receives the delayed clock signal from inverter chain 562 through signal path 564 and the delayed clock signal from inverter chain 566 through signal path 568. If the rising edge of the delayed clock signal on signal path 564 arrives to the input of latch 570 before the rising edge of the delayed clock signal on signal path 568, latch 570 outputs a logic high level signal on $D_n1c$ signal path 572 and a logic low level signal on $D_n2c$ signal path 574. If the rising edge of the delayed clock signal on signal path 568 arrives to the input of latch 570 before the rising edge of the delayed clock signal on signal path 564, latch 570 outputs a logic low level signal on $D_n1c$ signal path 572 and a logic high level signal on $D_n2c$ signal path 574. Latch 570 maintains the output signals on $D_n1c$ signal path 572 and $D_n2c$ signal path 574 until another evaluation is performed.

Reference circuit 500 outputs the $V_{nRFF}$ signal to inverter chain 582 through signal path 516. The $V_{nRFF}$ signal is received by inverter chain 582 and controls inverter chain 582. Inverter chain 582 receives the CLK signal through CLK signal path 122 as an input. Based on the $V_{nRFF}$ signal received from reference circuit 500, the CLK signal is delayed as it propagates through inverter chain 582. Inverter chain 582 outputs a delayed clock signal, which is proportional to the $V_{nRFF}$ signal received from reference circuit 500, to latch 590 through signal path 584.

Test circuit 150a outputs the $V_{nM}$ signal to inverter chain 586 through signal path 152a. The $V_{nM}$ signal is received by inverter chain 586 and controls inverter chain 586. Inverter chain 586 receives the CLK signal through CLK signal path 122 as an input. Based on the $V_{nM}$ signal received from test circuit 150a, the CLK signal is delayed as it propagates through inverter chain 586. Inverter chain 586 outputs a delayed clock signal, which is proportional to the $V_{nM}$ signal received from test circuit 150a, to latch 590 through signal path 588.

Latch 590 receives the delayed clock signal from inverter chain 582 through signal path 584 and the delayed clock signal from inverter chain 586 through signal path 588. If the rising edge of the delayed clock signal on signal path 584 arrives to the input of latch 590 before the rising edge of the delayed clock signal on signal path 588, latch 590 outputs a logic high level signal on $D_n$1d signal path 592 and a logic low level signal on $D_n$2d signal path 594. If the rising edge of the delayed clock signal on signal path 588 arrives to the input of latch 590 before the rising edge of the delayed clock signal on signal path 584, latch 590 outputs a logic low level signal on $D_n$1d signal path 592 and a logic high level signal on $D_n$2d signal path 594. Latch 590 maintains the output signals on $D_n$1d signal path 592 and $D_n$2d signal path 594 until another evaluation is performed.

Table I below indicates the values for $D_n$1a, $D_n$2a, $D_n$1b, $D_n$2b, $D_n$1c, $D_n$2c, $D_n$1d, and $D_n$2d based on the value of $V_{nM}$. A "0" indicates a logic low level and a "1" indicates a logic high level. The outputs indicating the process for nFET 344 are passed to OCD 112 or other circuits to adjust the circuits based on the process.

for pFET 408. In other embodiments, reference circuit 600 includes more than four resistors to provide more than four reference voltages. Any suitable number of resistors to provide any suitable number of reference voltages can be provided.

Figure 17:
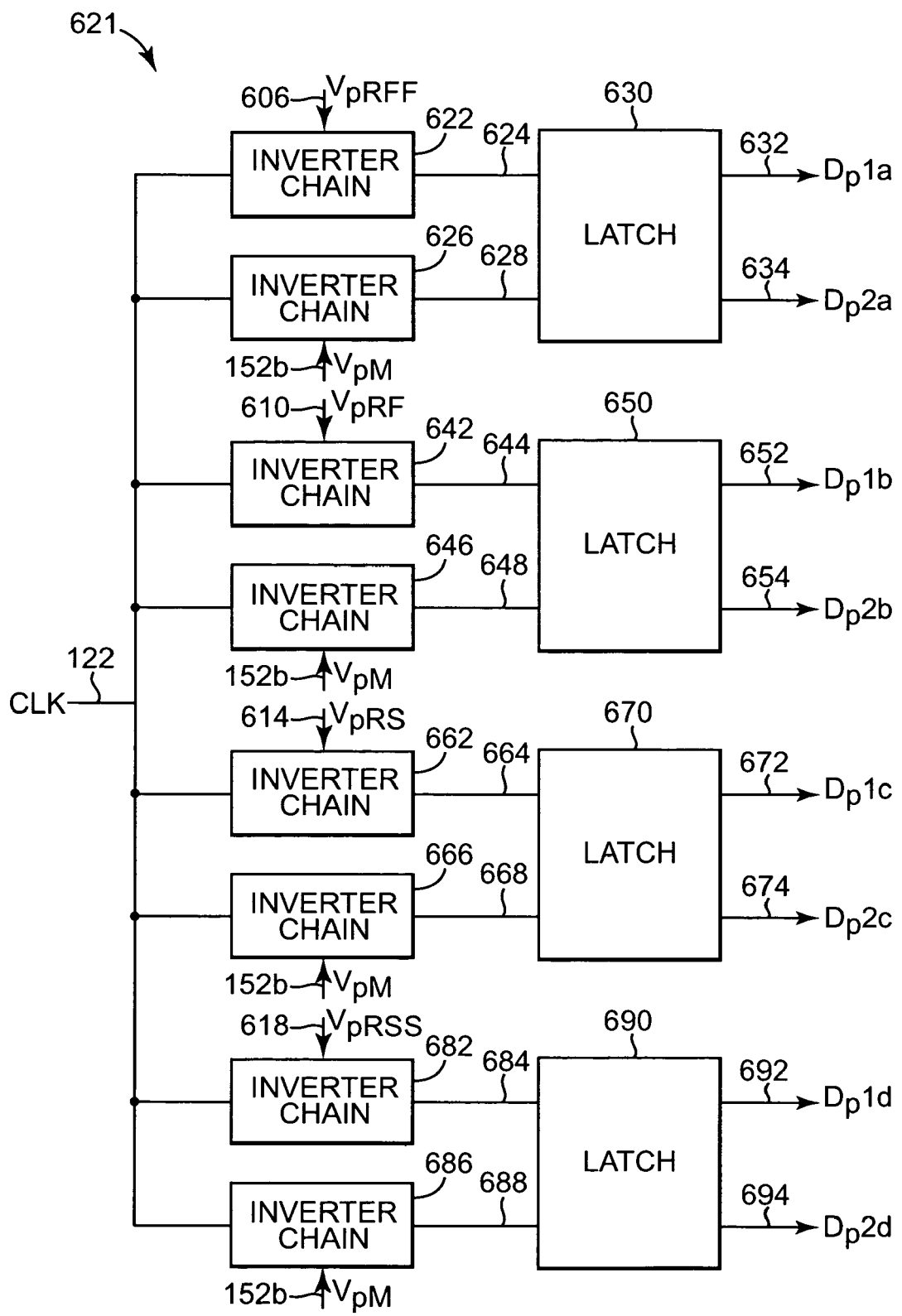
FIG. 17 is a block diagram illustrating one embodiment of an evaluation circuit having multiple latches for evaluating the process of a pFET.

FIG. 17 is a block diagram illustrating one embodiment of an evaluation circuit 621 having multiple latches for evaluating the process for pFET 408. Evaluation circuit 621 includes inverter chains 622, 626, 642, 646, 662, 666, 682, and 686, and latches 630, 650, 670, and 690. In one embodiment, inverter chains 626, 646, 666, and 686, are replaced with a single inverter having an output coupled to latches 630, 650, 670, and 690. Inverter chains 622, 626, 642, 646, 662, 666, 682, and 686 are similar to inverter chain 128. Latches 630, 650, 670, and 690 are similar to latch 140.

Inverter chain 622 is electrically coupled to $V_{pRFF}$ signal path 606, CLK signal path 122, and latch 630 through signal path 624. Inverter chain 626 is electrically coupled to $V_{pM}$ signal path 152b, CLK signal path 122, and latch 630 through signal path 628. Latch 630 is electrically coupled to pFET latch A data one ($D_p$1a) signal path 632 and pFET latch A data two ($D_p$2a) signal path 634.

Inverter chain 642 is electrically coupled to $V_{pRF}$ signal path 610, CLK signal path 122, and latch 650 through signal path 644. Inverter chain 646 is electrically coupled to $V_{pM}$ signal path 152b, CLK signal path 122, and latch 650 through signal path 648. Latch 650 is electrically coupled to pFET latch B data one ($D_p$1b) signal path 652 and pFET latch B data two ($D_p$2b) signal path 654.

Inverter chain 662 is electrically coupled to $V_{pRS}$ signal path 614, CLK signal path 122, and latch 670 through signal path 664. Inverter chain 666 is electrically coupled to $V_{pM}$ signal path 152b, CLK signal path 122, and latch 670 through signal path 668. Latch 670 is electrically coupled to pFET latch C data one ($D_p$1c) signal path 672 and pFET latch C data two ($D_p$2c) signal path 674.

TABLE I

| $V_{nM}$ | $D_n$1a | $D_n$2a | $D_n$1b | $D_n$2b | $D_n$1c | $D_n$2c | $D_n$1d | $D_n$2d | Process |
|---|---|---|---|---|---|---|---|---|---|
| $V_{nM} > V_{nRSS}$ | 0 | 1 | 0 | 1 | 0 | 1 | 0 | 1 | Slowest |
| $V_{nRSS} > V_{nM} > V_{nRS}$ | 1 | 0 | 0 | 1 | 0 | 1 | 0 | 1 | Slow |
| $V_{nRS} > V_{nM} > V_{nRF}$ | 1 | 0 | 1 | 0 | 0 | 1 | 0 | 1 | Nominal |
| $V_{nRF} > V_{nM} > V_{nRFF}$ | 1 | 0 | 1 | 0 | 1 | 0 | 0 | 1 | Fast |
| $V_{nM} < V_{nRFF}$ | 1 | 0 | 1 | 0 | 1 | 0 | 1 | 0 | Fastest |

Figure 16:
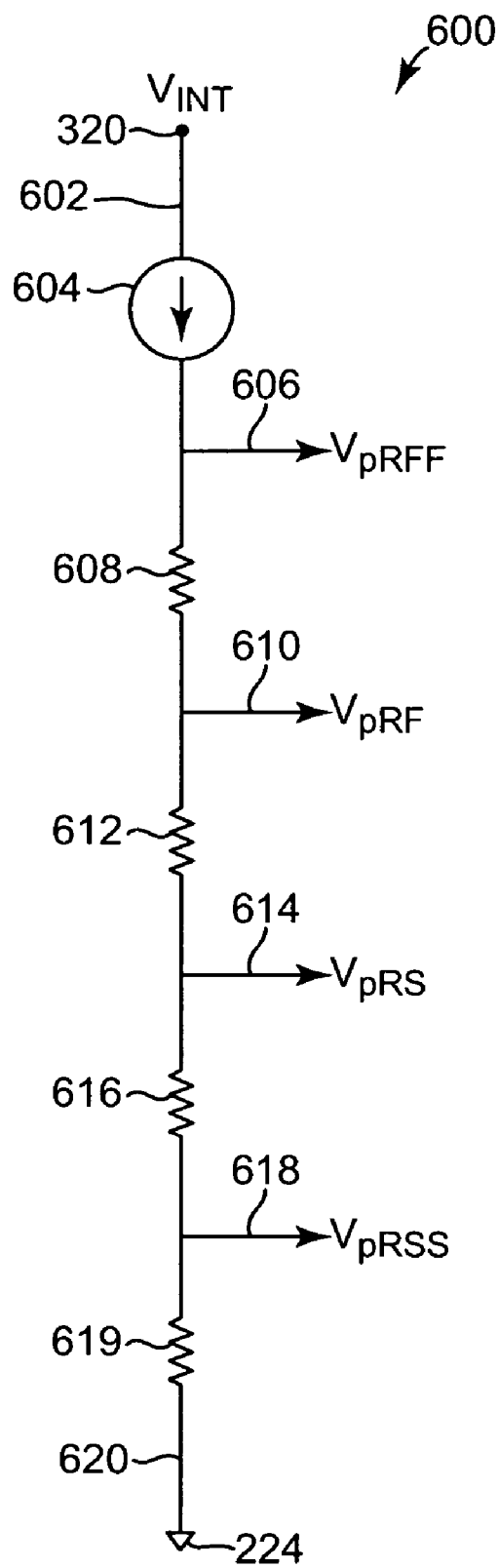
FIG. 16 is a schematic diagram illustrating one embodiment of a reference circuit for providing multiple reference signals for evaluating the process of a pFET.

FIG. 16 is a schematic diagram illustrating one embodiment of a reference circuit 600 for providing multiple reference signals for evaluating the process for a pFET. Reference circuit 600 includes current source 604 and resistors 608, 612, 616, and 619. Current source 604 is electrically coupled to $V_{INT}$ 320 through path 602 and resistor 608 through fastest process pFET reference voltage ($V_{pRFF}$) signal path 606. Resistor 608 is electrically coupled to resistor 612 through fast process pFET reference voltage ($V_{pRF}$) signal path 610. Resistor 612 is electrically coupled to resistor 616 through slow process pFET reference voltage ($V_{pRS}$) signal path 614. Resistor 616 is electrically coupled to resistor 619 through slowest process pFET reference voltage ($V_{pRSS}$) signal path 618. Resistor 619 is electrically coupled to common or ground 224 through path 620. The sum of the resistances of resistors 608, 612, 616, and 619 is substantially equal to the resistance of resistor 410.

Reference circuit 600 provides four reference voltages to compare to $V_{pM}$ from test circuit 150b. $V_{pRSS}$ indicates the slowest process for pFET 408. $V_{pRS}$ indicates a slow process for pFET 408, but faster than $V_{pRSS}$. $V_{pRF}$ indicates a fast process for pFET 408 and $V_{pRFF}$ indicates the fastest process Inverter chain 682 is electrically coupled to $V_{pRSS}$ signal path 618, CLK signal path 122, and latch 690 through signal path 684. Inverter chain 686 is electrically coupled to $V_{pM}$ signal path 152b, CLK signal path 122, and latch 690 through signal path 688. Latch 690 is electrically coupled to pFET latch D data one ($D_p$1d) signal path 692 and pFET latch D data two ($D_p$2d) signal path 694.

Reference circuit 600 outputs the $V_{pRFF}$ signal to inverter chain 622 through signal path 606. The $V_{pRFF}$ signal is received by inverter chain 622 and controls inverter chain 622. Inverter chain 622 receives the CLK signal through CLK signal path 122 as an input. Based on the $V_{pRFF}$ signal received from reference circuit 600, the CLK signal is delayed as it propagates through inverter chain 622. Inverter chain 622 outputs a delayed clock signal, which is proportional to the $V_{pRFF}$ signal received from reference circuit 600, to latch 630 through signal path 624.

Test circuit 150b outputs the $V_{pM}$ signal to inverter chain 626 through signal path 152b. The $V_{pM}$ signal is received by inverter chain 626 and controls inverter chain 626. Inverter chain 626 receives the CLK signal through CLK signal path 122 as an input. Based on the $V_{pM}$ signal received from test circuit 150b, the CLK signal is delayed as it propagates through inverter chain 626. Inverter chain 626 outputs a delayed clock signal, which is proportional to the $V_{pM}$ signal received from test circuit 150b, to latch 630 through signal path 628.

Latch 630 receives the delayed clock signal from inverter chain 622 through signal path 624 and the delayed clock signal from inverter chain 626 through signal path 628. If the rising edge of the delayed clock signal on signal path 624 arrives to the input of latch 630 before the rising edge of the delayed clock signal on signal path 628, latch 630 outputs a logic high level signal on $D_p1a$ signal path 632 and a logic low level signal on $D_p2a$ signal path 634. If the rising edge of the delayed clock signal on signal path 628 arrives to the input of latch 630 before the rising edge of the delayed clock signal on signal path 624, latch 630 outputs a logic low level signal on $D_p1a$ signal path 632 and a logic high level signal on $D_p2a$ signal path 634. Latch 630 maintains the output signals on $D_p1a$ signal path 632 and $D_p2a$ signal path 634 until another evaluation is performed.

Reference circuit 600 outputs the $V_{pRF}$ signal to inverter chain 642 through signal path 610. The $V_{pRF}$ signal is received by inverter chain 642 and controls inverter chain 642. Inverter chain 642 receives the CLK signal through CLK signal path 122 as an input. Based on the $V_{pRF}$ signal received from reference circuit 600, the CLK signal is delayed as it propagates through inverter chain 642. Inverter chain 642 outputs a delayed clock signal, which is proportional to the $V_{pRF}$ signal received from reference circuit 600, to latch 650 through signal path 644.

Test circuit 150b outputs the $V_{pM}$ signal to inverter chain 646 through signal path 152b. The $V_{pM}$ signal is received by inverter chain 646 and controls inverter chain 646. Inverter chain 646 receives the CLK signal through CLK signal path 122 as an input. Based on the $V_{pM}$ signal received from test circuit 150b, the CLK signal is delayed as it propagates through inverter chain 646. Inverter chain 646 outputs a delayed clock signal, which is proportional to the $V_{pM}$ signal received from test circuit 150b to latch 650 through signal path 648.

Latch 650 receives the delayed clock signal from inverter chain 642 through signal path 644 and the delayed clock signal from inverter chain 646 through signal path 648. If the rising edge of the delayed clock signal on signal path 644 arrives to the input of latch 650 before the rising edge of the delayed clock signal on signal path 648, latch 650 outputs a logic high level signal on $D_p1b$ signal path 652 and a logic low level signal on $D_p2b$ signal path 654. If the rising edge of the delayed clock signal on signal path 648 arrives to the input of latch 650 before the rising edge of the delayed clock signal on signal path 644, latch 650 outputs a logic low level signal on $D_p1b$ signal path 652 and a logic high level signal on $D_p2b$ signal path 654. Latch 650 maintains the output signals on $D_p1b$ signal path 652 and $D_p2b$ signal path 654 until another evaluation is performed.

Reference circuit 600 outputs the $V_{pRS}$ signal to inverter chain 662 through signal path 614. The $V_{pRS}$ signal is received by inverter chain 662 and controls inverter chain 662. Inverter chain 662 receives the CLK signal through CLK signal path 122 as an input. Based on the $V_{pRS}$ signal received from reference circuit 600, the CLK signal is delayed as it propagates through inverter chain 662. Inverter chain 662 outputs a delayed clock signal, which is proportional to the $V_{pRS}$ signal received from reference circuit 600, to latch 670 through signal path 664.

Test circuit 150b outputs the $V_{pM}$ signal to inverter chain 666 through signal path 152b. The $V_{pM}$ signal is received by inverter chain 666 and controls inverter chain 666. Inverter chain 666 receives the CLK signal through CLK signal path 122 as an input. Based on the $V_{pM}$ signal received from test circuit 150b, the CLK signal is delayed as it propagates through inverter chain 666. Inverter chain 666 outputs a delayed clock signal, which is proportional to the $V_{pM}$ signal received from test circuit 150b, to latch 670 through signal path 668.

Latch 670 receives the delayed clock signal from inverter chain 662 through signal path 664 and the delayed clock signal from inverter chain 666 through signal path 668. If the rising edge of the delayed clock signal on signal path 664 arrives to the input of latch 670 before the rising edge of the delayed clock signal on signal path 668, latch 670 outputs a logic high level signal on $D_p1c$ signal path 672 and a logic low level signal on $D_p2c$ signal path 674. If the rising edge of the delayed clock signal on signal path 668 arrives to the input of latch 670 before the rising edge of the delayed clock signal on signal path 664, latch 670 outputs a logic low level signal on $D_p1c$ signal path 672 and a logic high level signal on $D_p2c$ signal path 674. Latch 670 maintains the output signals on $D_p1c$ signal path 672 and $D_p2c$ signal path 674 until another evaluation is performed.

Reference circuit 600 outputs the $V_{pRSS}$ signal to inverter chain 682 through signal path 618. The $V_{pRSS}$ signal is received by inverter chain 682 and controls inverter chain 682. Inverter chain 682 receives the CLK signal through CLK signal path 122 as an input. Based on the $V_{pRSS}$ signal received from reference circuit 600, the CLK signal is delayed as it propagates through inverter chain 682. Inverter chain 682 outputs a delayed clock signal, which is proportional to the $V_{pRSS}$ signal received from reference circuit 600, to latch 690 through signal path 684.

Test circuit 150b outputs the $V_{pM}$ signal to inverter chain 686 through signal path 152b. The $V_{pM}$ signal is received by inverter chain 686 and controls inverter chain 686. Inverter chain 686 receives the CLK signal through CLK signal path 122 as an input. Based on the $V_{pM}$ signal received from test circuit 150b, the CLK signal is delayed as it propagates through inverter chain 686. Inverter chain 686 outputs a delayed clock signal, which is proportional to the $V_{pM}$ signal received from test circuit 150b, to latch 690 through signal path 688.

Latch 690 receives the delayed clock signal from inverter chain 682 through signal path 684 and the delayed clock signal from inverter chain 686 through signal path 688. If the rising edge of the delayed clock signal on signal path 684 arrives to the input of latch 690 before the rising edge of the delayed clock signal on signal path 688, latch 690 outputs a logic high level signal on $D_p1d$ signal path 692 and a logic low level signal on $D_p2d$ signal path 694. If the rising edge of the delayed clock signal on signal path 688 arrives to the input of latch 690 before the rising edge of the delayed clock signal on signal path 684, latch 690 outputs a logic low level signal on $D_p1d$ signal path 692 and a logic high level signal on $D_p2d$ signal path 694. Latch 690 maintains the output signals on $D_p1d$ signal path 692 and $D_p2d$ signal path 694 until another evaluation is performed.

Table II below indicates the values for $D_p1a$, $D_p2a$, $D_p1b$, $D_p2b$, $D_p1c$, $D_p2c$, $D_p1d$, and $D_p2d$ based on the value of $V_{pM}$. A "0" indicates a logic low level and a "1" indicates a logic high level. The outputs indicating the process for pFET 408 are passed to OCD 112 or other circuits to adjust the circuits based on the process.

TABLE II

| $V_{pM}$ | $D_p1a$ | $D_p2a$ | $D_p1b$ | $D_p2b$ | $D_p1c$ | $D_p2c$ | $D_p1d$ | $D_p2d$ | Process |
|---|---|---|---|---|---|---|---|---|---|
| $V_{pM} > V_{pRFF}$ | 0 | 1 | 0 | 1 | 0 | 1 | 0 | 1 | Fastest |
| $V_{pRFF} > V_{pM} > V_{pRF}$ | 1 | 0 | 0 | 1 | 0 | 1 | 0 | 1 | Fast |
| $V_{pRF} > V_{pM} > V_{pRS}$ | 1 | 0 | 1 | 0 | 0 | 1 | 0 | 1 | Nominal |
| $V_{pRS} > V_{pM} > V_{pRSS}$ | 1 | 0 | 1 | 0 | 1 | 0 | 0 | 1 | Slow |
| $V_{pM} < V_{pRSS}$ | 1 | 0 | 1 | 0 | 1 | 0 | 1 | 0 | Slowest |

The evaluation circuits described herein enable high speed evaluation of the process and voltage characteristics of a semiconductor chip. The information obtained from the evaluation circuits can be used to adjust the semiconductor chip to compensate for any effects due to variations in the process or voltage characteristics.

What is claimed is:

1. An evaluation circuit comprising:
a test circuit configured to provide a test voltage indicative of a characteristic of a semiconductor device;
a reference circuit configured to provide a first reference voltage;
a first delay circuit configured to convert the test voltage into a first delay;
a second delay circuit configured to convert the first reference voltage into a second delay; and
a first latching circuit configured to determine a relationship between the first delay and the second delay.

2. The evaluation circuit of claim 1, wherein the characteristic of the semiconductor device is a characteristic of a transistor in the semiconductor device.

3. The evaluation circuit of claim 2, wherein the transistor is one of a negative channel field effect transistor and a positive channel field effect transistor.

4. The evaluation circuit of claim 2, wherein the characteristic of the transistor is a process of the transistor.

5. The evaluation circuit of claim 1, wherein the characteristic of the semiconductor device is a supplied voltage level.

6. The evaluation circuit of claim 1, wherein the test circuit comprises a voltage divider.

7. The evaluation circuit of claim 1, wherein the reference circuit comprises one of a current source and a voltage source.

8. The evaluation circuit of claim 1, wherein the first delay circuit comprises a current starved inverter controlled by the test voltage, the current starved inverter having a clock signal input and a delayed clock signal output indicative of the test voltage.

9. The evaluation circuit of claim 1, wherein the second delay circuit comprises a current starved inverter controlled by the first reference voltage, the current starved inverter having a clock signal input and a delayed clock signal output indicative of the first reference voltage.

10. The evaluation circuit of claim 1, wherein the test circuit comprises a first resistor for dividing an internal voltage and the reference circuit comprises a second resistor for dividing the internal voltage.

11. The evaluation circuit of claim 10, wherein the first resistor and the second resistor have a same resistance value.

12. The evaluation circuit of claim 1, wherein the first latching circuit comprises a NAND latch.

13. The evaluation circuit of claim 1, wherein the first latching circuit is configured to latch a signal indicating which one of the first delay and the second delay is shorter.

14. The evaluation circuit of claim 1, wherein the reference circuit is configured to provide a second reference voltage, the evaluation circuit further comprising:
a third delay circuit configured to convert the second reference voltage into a third delay; and
a second latching circuit configured to determine a relationship between the first delay and the third delay.

15. The evaluation circuit of claim 14, wherein the reference circuit is configured to provide a third reference voltage and a fourth reference voltage, the evaluation circuit further comprising:
a fourth delay circuit configured to convert the third reference voltage into a fourth delay;
a fifth delay circuit configured to convert the fourth reference voltage into a fifth delay;
a third latching circuit configured to determine a relationship between the first delay and the fourth delay; and
a fourth latching circuit configured to determine a relationship between the first delay and the fifth delay.

16. The evaluation circuit of claim 15, wherein the first reference voltage indicates a first process for the characteristic of the semiconductor device, the second reference voltage indicates a second process for the characteristic of the semiconductor device, the third reference voltage indicates a third process for the characteristic of the semiconductor device, and the fourth reference voltage indicates a fourth process for the characteristic of the semiconductor device.

17. The evaluation circuit of claim 16, wherein the first process is slower than the second process, the second process is slower than the third process, and the third process is slower than the fourth process.

18. A semiconductor process evaluation circuit comprising:
A first test circuit configured to receive an external voltage and provide a first signal indicative of the external voltage;
a first current starved inverter chain controlled by the first signal, the first current starved inverter chain configured to receive a clock signal and provide a first delayed clock signal indicative of the first signal;
a first reference circuit configured to provide a second signal indicative of a nominal value for the first signal;
a second current starved inverter chain controlled by the second signal, the second current starved inverter chain configured to receive the clock signal and provide a second delayed clock signal indicative of the second signal;
a second test circuit configured to provide a third signal indicative of a process of a transistor;
a third current starved inverter chain controlled by the third signal, the third current starved inverter chain configured to receive the second delayed clock signal and provide a third delayed clock signal indicative of the third signal and the second signal;

a second reference circuit configured to provide a fourth signal indicative of a nominal value for the third signal;

a fourth current starved inverter chain controlled by the fourth signal, the fourth current starved inverter chain configured to receive the first delayed clock signal and provide a fourth delayed clock signal indicative of the fourth signal and the first signal; and a latch configured to receive the third delayed clock signal and the fourth delayed clock signal and determine whether the third delayed clock signal is delayed less than the fourth delayed clock signal.

19. The semiconductor process evaluation circuit of claim 18, wherein the transistor is one of a negative channel field effect transistor and a positive channel field effect transistor.

20. A process detector comprising:
means for providing a test voltage indicative of a characteristic of a semiconductor device;
means for converting the test voltage into a first delay;
means for providing a first reference voltage;
means for converting the first reference voltage into a second delay;
means for determining a relationship between the first delay and the second delay
means for providing a second reference voltage;
means for converting the second reference voltage to a third delay; and
means for determining a relationship between the first delay and the third delay.

21. A method for evaluating a characteristic in a semiconductor device, the method comprising:
generating a test voltage indicative of a characteristic of a semiconductor device;
generating a first reference voltage;
converting the test voltage into a first delayed clock signal indicative of the test voltage;
converting the first reference voltage into a second delayed clock signal indicative of the first reference voltage; and
determining which of the first delayed clock signal and the second delayed clock signal is delayed less,
wherein determining which of the first delayed clock signal and the second delayed clock signal is delayed less comprises latching the first of the first delayed clock signal and the second delayed clock signal to transition to a logic high level.

22. The method of claim 21, wherein the characteristic of the semiconductor device is a supplied voltage to the semiconductor device.

23. The method of claim 21, wherein the characteristic of the semiconductor device is a characteristic of a field effect transistor in the semiconductor device.

24. The method of claim 21, wherein converting the test voltage into a first delayed clock signal comprises delaying a clock signal through a current starved inverter controlled by the test voltage.

25. The method of claim 21, wherein converting the first reference voltage into a second delayed clock signal comprises delaying a clock signal through a current starved inverter controlled by the first reference voltage.

26. The method of claim 21, further comprising:
generating a second reference voltage;
converting the second reference voltage into a third delayed clock signal indicative of the second reference voltage; and
determining which of the third delayed clock signal and the first delayed clock signal is delayed less.

27. A memory system comprising:
a process detector circuit comprising:
a test circuit configured to provide a test voltage indicative of one of a voltage and process characteristic of a semiconductor device;
a reference circuit configured to provide a reference voltage;
a first delay circuit including a first current starved inverter controlled by the test voltage, the first delay circuit configured to convert the test voltage into a first delay;
a second delay circuit including a second current starved inverter controlled by the reference voltage, the second delay circuit configured to convert the reference voltage into a second delay; and
a latching circuit configured to determine a relationship between the first delay and the second delay;
an off chip driver circuit configured to be adjusted based on the relationship between the first delay and the second delay; and
a dynamic random access memory configured to communicate with the off chip driver.

28. The memory system of claim 27, wherein the random access memory comprises a synchronous dynamic random access memory.

29. The memory system of claim 27, wherein the memory comprises a double data rate synchronous dynamic random access memory.

30. A method for evaluating a characteristic in a semiconductor device, the method comprising:
generating a test voltage indicative of a characteristic of a semiconductor device;
generating a first reference voltage;
converting the test voltage into a first delayed clock signal indicative of the test voltage;
converting the first reference voltage into a second delayed clock signal indicative of the first reference voltage; and
determining which of the first delayed clock signal and the second delayed clock signal is delayed less,
wherein converting the test voltage into a first delayed clock signal comprises delaying a clock signal through a current starved inverter controlled by the test voltage.

31. A method for evaluating a characteristic in a semiconductor device, the method comprising:
generating a test voltage indicative of a characteristic of a semiconductor device;
generating a first reference voltage;
converting the test voltage into a first delayed clock signal indicative of the test voltage;
converting the first reference voltage into a second delayed clock signal indicative of the first reference voltage; and
determining which of the first delayed clock signal and the second delayed clock signal is delayed less,
wherein converting the first reference voltage into a second delayed clock signal comprises delaying a clock signal through a current starved inverter controlled by the first reference voltage.

32. A method for evaluating a characteristic in a semiconductor device, the method comprising:
generating a test voltage indicative of a characteristic of a semiconductor device;
generating a first reference voltage;

converting the test voltage into a first delayed clock signal indicative of the test voltage;
converting the first reference voltage into a second delayed clock signal indicative of the first reference voltage; and
determining which of the first delayed clock signal and the second delayed clock signal is delayed less;
generating a second reference voltage;

converting the second reference voltage into a third delayed clock signal indicative of the second reference voltage; and
determining which of the third delayed clock signal and the first delayed clock signal is delayed less.

* * * * *